US010164688B2

United States Patent
Rothkopf et al.

(10) Patent No.: US 10,164,688 B2
(45) Date of Patent: Dec. 25, 2018

(54) ACTUATOR ASSISTED ALIGNMENT OF CONNECTIBLE DEVICES

(71) Applicant: Apple Inc., Cupertino, CA (US)

(72) Inventors: Fletcher R. Rothkopf, Cupertino, CA (US); Haran Balaram, Cupertino, CA (US); Colin M. Ely, Cupertino, CA (US)

(73) Assignee: Apple Inc., Cupertino, CA (US)

( * ) Notice: Subject to any disclaimer, the term of this patent is extended or adjusted under 35 U.S.C. 154(b) by 452 days.

(21) Appl. No.: 14/265,424

(22) Filed: Apr. 30, 2014

(65) Prior Publication Data
US 2015/0318100 A1 Nov. 5, 2015

(51) Int. Cl.
| H01H 47/24 | (2006.01) |
| H04B 5/00 | (2006.01) |
| H01F 7/06 | (2006.01) |
| G01R 33/02 | (2006.01) |
| G01R 33/07 | (2006.01) |
| H01F 7/18 | (2006.01) |
| H01F 38/14 | (2006.01) |

(52) U.S. Cl.
CPC ........... *H04B 5/0075* (2013.01); *G01R 33/02* (2013.01); *G01R 33/072* (2013.01); *H01F 7/06* (2013.01); *H01F 7/064* (2013.01); *H01F 7/1844* (2013.01); *H01F 38/14* (2013.01); *H04B 5/0031* (2013.01); *H04B 5/0037* (2013.01); *H04B 5/0087* (2013.01)

(58) Field of Classification Search
CPC ..... H01F 7/064; H04B 5/0075; H04B 5/0037; G01R 33/02

USPC .......................................................... 361/179
See application file for complete search history.

(56) References Cited

U.S. PATENT DOCUMENTS 5,251,863 A * 10/1993 Gossman .............. F16F 7/1005
248/550
6,065,663 A * 5/2000 Koduri .................. B23K 20/005
156/580.1
(Continued)

FOREIGN PATENT DOCUMENTS

| CN | 1926917 | 3/2007 |
| CN | 101427393 | 5/2009 |

(Continued)

*Primary Examiner* — Thienvu Tran
*Assistant Examiner* — Lucy Thomas
(74) *Attorney, Agent, or Firm* — Kilpatrick Townsend & Stockton LLP

(57) ABSTRACT

A first electronic device is positionable between one or more contact positions and an aligned position with respect to a second electronic device. One or more actuators of the first electronic device are activated in response to one or more sensors of the first electronic device determining that the first electronic device and second electronic device are misaligned. Activation of the actuator may result in the first electronic device moving to the aligned position. In some implementations, the actuator may move the first electronic device toward the aligned position when activated. In other implementations, the actuator may overcome static friction to put the first electronic device in motion when activated and when the first electronic device is in motion one or more alignment mechanisms may overcome the kinetic friction to move the first electronic device to the aligned position.

25 Claims, 6 Drawing Sheets

(56) References Cited

U.S. PATENT DOCUMENTS

| | | | |
|---|---|---|---|
| 6,280,390 B1* | 8/2001 | Akselrod | A61B 5/02416 |
| | | | 600/475 |
| 7,503,989 B2 | 3/2009 | Picciotto et al. | |
| 8,717,151 B2 | 5/2014 | Forutanpour et al. | |
| 8,912,686 B2* | 12/2014 | Stoner, Jr. | H02J 5/005 |
| | | | 307/104 |
| 2004/0209489 A1* | 10/2004 | Clapper | H01R 13/6205 |
| | | | 439/39 |
| 2006/0181007 A1* | 8/2006 | Kruger | B65H 31/34 |
| | | | 271/207 |
| 2009/0047824 A1* | 2/2009 | Seibert | H01R 13/641 |
| | | | 439/490 |
| 2011/0133726 A1* | 6/2011 | Ballantyne | G01B 7/31 |
| | | | 324/207.11 |
| 2013/0314180 A1 | 11/2013 | Yeo et al. | |
| 2014/0015493 A1* | 1/2014 | Wirz | H02J 50/90 |
| | | | 320/137 |
| 2014/0043053 A1 | 2/2014 | Huber et al. | |
| 2016/0023245 A1 | 1/2016 | Zadesky et al. | |

FOREIGN PATENT DOCUMENTS

| | | |
|---|---|---|
| CN | 102460938 | 5/2012 |
| CN | 102648860 | 8/2012 |
| KR | 20130005715 | 1/2013 |

* cited by examiner

ACTUATOR ASSISTED ALIGNMENT OF CONNECTIBLE DEVICES

TECHNICAL FIELD

This disclosure relates generally to connectible devices, and more specifically to using an actuator to assist alignment of connectible devices.

BACKGROUND

Electronic devices may be connected wired and/or wirelessly for a variety of different purposes. For example, electronic devices may be connected for the purposes of data and/or other information transmission, power transmission, and/or for the purposes of any other interaction between the devices.

In many cases, such devices may need to be aligned in order to connect. For example, the devices may be brought into proximity in one of a number of different contact positions and then moved from such a contact position to an aligned position. In the aligned position, one or more components of the devices (such as one or more contacts, wired and/or wireless communication components, power transmission components, and so on) may be aligned such that connection is possible.

Aligning the devices may prove problematic for users. Either or both of the devices may include one or more alignment mechanisms to move the devices from contact positions to the aligned position. However, if the devices come to rest prior to the aligned position, the alignment mechanisms may not be sufficient to overcome the static friction between the devices. As such, the devices may not be properly aligned in the aligned position.

SUMMARY

The present disclosure discloses systems, apparatuses, and methods for actuator assisted alignment of connectible devices. A first electronic device may be positionable between one or more contact positions and an aligned position with respect to a second electronic device. One or more actuators of the first electronic device may be activated in response to one or more sensors of the first electronic device determining that the first electronic device and second electronic device are misaligned. Activation of the actuator may result in the first electronic device moving from the contact position to the aligned position.

In some implementations, the actuator may move the first electronic device toward the aligned position when activated. In other implementations, the actuator may overcome static friction to put the first electronic device in motion when activated. Putting the first electronic device in motion may enable one or more alignment mechanisms of the first and/or second electronic devices to overcome the kinetic friction between first and second electronic devices to move the first electronic device to the aligned position.

In various implementations, one or more components of the first electronic device may align with one or more components of the second electronic device in the aligned position. Such alignment may enable the components, and thus the devices, to interact. For example, the components may be inductive power transmission coils that are able to transmit and/or receive power between the first and second electronic devices.

In some implementations, the sensor may be one or more communication components that receive one or more signals from the second electronic device indicating whether or not the first and second electronic devices are aligned. In other implementations, the sensor may be a position sensor, a gyroscope, an accelerometer, a compass, a hall effect sensor, a photoplethysmograph sensor, an inductive coil, a capacitive sensor, an optical sensor, a force sensor, a magnetometer, a combination thereof, or other such sensor operable to detect alignment and/or misalignment of the first and second electronic devices.

In one or more embodiments, a system for aligning electronic devices includes a first electronic device positionable between at least one contact position and an aligned position with respect to a second electronic device. The first electronic device includes at least one sensor and at least one actuator that is activated in response to the at least one sensor determining that the first electronic device is positioned in the at least one contact position. Activation of the at least one actuator results in the first electronic device moving to the aligned position.

In various embodiments, an electronic device positionable between at least one contact position and an aligned position with respect to an additional electronic device includes at least one sensor and at least one actuator that is activated in response to the at least one sensor determining that the first electronic device is positioned in the at least one contact position. Activation of the at least one actuator results in the first electronic device moving to the aligned position.

In some embodiments, a method for actuator assisted alignment of connectible electronic devices includes: determining that a first electronic device is misaligned with respect to a second electronic device utilizing at least one sensor and activating at least one actuator in response to the determination wherein activation of the at least one actuator results in the first electronic device moving to an aligned position.

It is to be understood that both the foregoing general description and the following detailed description are for purposes of example and explanation and do not necessarily limit the present disclosure. The accompanying drawings, which are incorporated in and constitute a part of the specification, illustrate subject matter of the disclosure. Together, the descriptions and the drawings serve to explain the principles of the disclosure.

DETAILED DESCRIPTION

Figure 1:
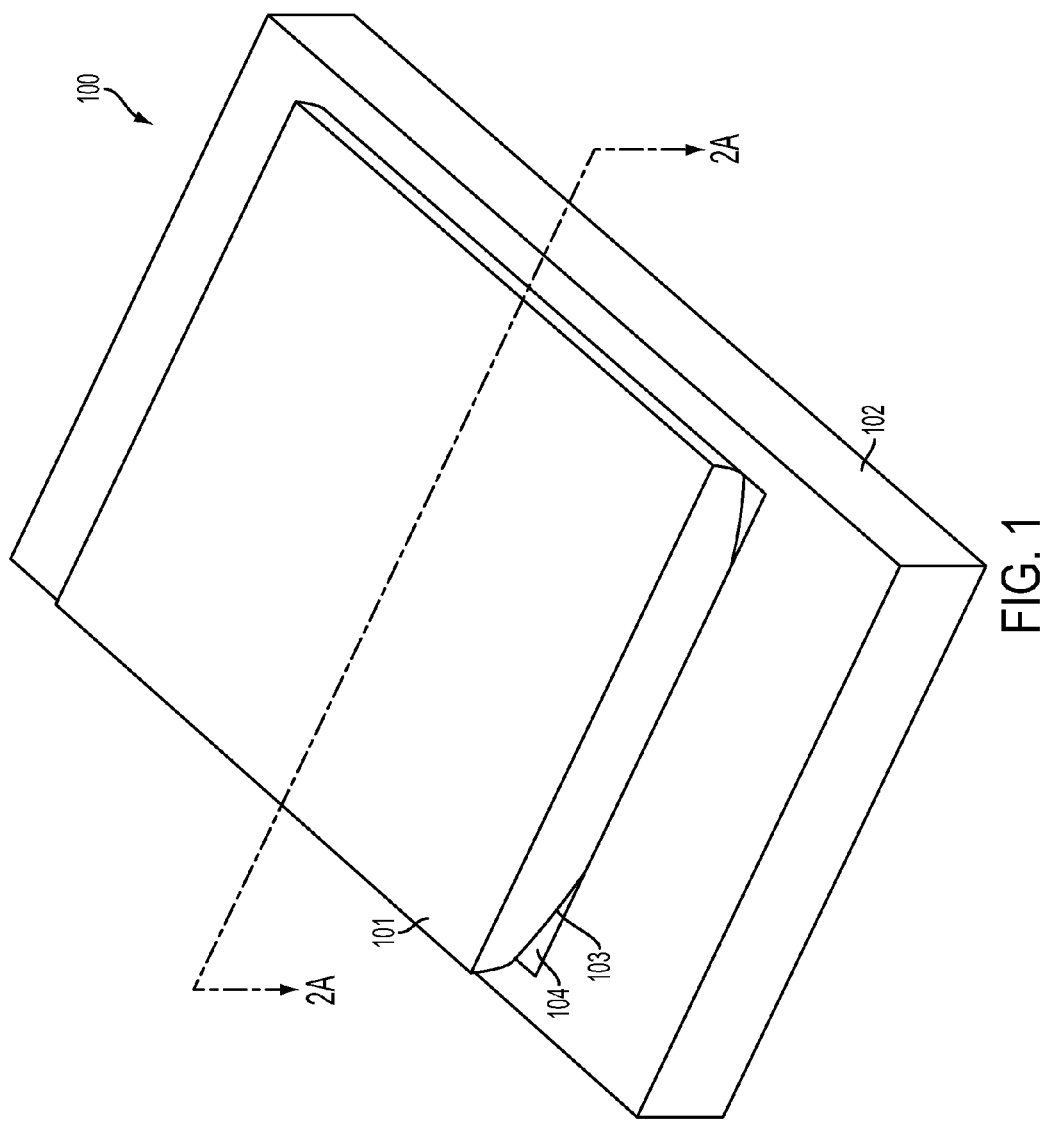
FIG. 1 is an isometric view of an example system for actuator assisted alignment of connectible devices.

The description that follows includes sample systems, apparatuses, and methods, that embody various elements of the present disclosure. However, it should be understood that the described disclosure may be practiced in a variety of forms in addition to those described herein.

The present disclosure discloses systems, apparatuses, and methods for actuator assisted alignment of connectible devices. A first electronic device may be positionable between one or more contact positions and an aligned position with respect to a second electronic device. One or more actuators of the first electronic device may be activated in response to one or more sensors of the first electronic device determining that the first electronic device and second electronic device are misaligned, i.e. the first electronic device is in a contact position instead of the aligned position. Activation of the actuator may result in the first electronic device moving from the contact position to the aligned position.

In some implementations, the actuator may move the first electronic device toward the aligned position when activated. For example, the actuator may be a linear actuator that is operable to move the first electronic device in one or more directions.

In other implementations, the actuator may overcome static friction to put the first electronic device in motion when activated (such as by vibrating the first electronic device, by repelling the first electronic device from the second electronic device utilizing one or more electromagnets, and/or by other mechanisms of putting the first electronic device in motion). Putting the first electronic device in motion may enable one or more alignment mechanisms of the first and/or second electronic devices to overcome the kinetic friction between first and second electronic devices (whereas the alignment mechanism may not have been sufficient to overcome the static friction between the devices) to move the first electronic device to the aligned position. Such alignment mechanism may include gravity, geometry and/or composition of interface surfaces of the first and/or second electronic device, one or more alignment magnets, and/or other such mechanisms for aligning the first and second electronic devices.

In various implementations, one or more components (such as one or more contacts, wired and/or wireless communication components, power transmission components, and so on) of the first electronic device may align with one or more components of the second electronic device in the aligned position. Such alignment may enable the components, and thus the devices, to interact. For example, the components may be inductive power transmission coils (which may each include alignment magnets positioned at their respective centers) that are able to transmit and/or receive power between the first and second electronic devices.

In some implementations, the sensor may be one or more communication components that receive one or more signals from the second electronic device indicating whether or not the first and second electronic devices are aligned. In other implementations, the sensor may be a position sensor, a gyroscope, an accelerometer, a compass, a hall effect sensor, an optical sensor, an inductive coil, a capacitive sensor, a force sensor, a magnetometer, a combination thereof, or other such sensor operable to detect alignment and/or misalignment of the first and second electronic devices.

For example, the sensor may be one or more optical sensors (such as a PPG sensor) that detect one or more marked areas (which may include a colored area, such as one or more dots, rings, and/or other areas of infrared paint and/or other coloring mechanisms) of an interface surface of the second electronic device. In one instance, such an optical sensor may be positioned between an alignment magnet of the first electronic device and an interface surface of the first electronic device.

By way of another example, the first and second electronic device may respectively include first and second alignment magnets that are utilized in moving the first electronic device from contact positions to the aligned position. In such a case, the sensor may be hall effect sensors positioned on the sides of the alignment magnet of the first electronic device. The magnetic fields detected by the respective hall effect sensors may be compared to determine whether or not the first and second electronic devices are aligned.

By way of still another example, the sensor may be one or more position sensors that detect an orientation of the first electronic device, a center of gravity of the electronic device, and/or other such position information regarding the electronic device. From this position information, it may be determined whether or not the first electronic device is aligned with the second electronic device.

By way of yet another example, the sensor may be an inductive power transmission coil that receives power from and/or transmits power to a corresponding inductive power transmission coil of the second electronic device. If the coils are not aligned because the first and second electronic devices are not in the aligned position, the received power may differ from the transmitted power. As such, the inductive power transmission of the first electronic device may determine whether the devices are misaligned or not by comparing the received power to the transmitted power.

FIG. 1 is an isometric view of an example system 100 for actuator assisted alignment of connectible devices. The system may include a first electronic device 101 that is connectible to a second electronic device 102. Such connection may be accomplished by contacting an interface surface 103 of the first electronic device to an interface surface 104 of the second electronic device and moving the devices from one of a possible number of contact positions to an aligned position.

As illustrated, the first electronic device 101 is a portable electronic device and the second electronic device 102 is a dock (such as a data dock, a power dock, a charging dock, and/or other kind of dock) for the portable electronic device. However, it is understood that this is an example. In various implementations, either the first and/or second electronic device may be any kind of electronic device such as a laptop computer, a desktop computer, a cellular telephone, a smart phone, a wearable device, a charger, a power adapter, a dock, a docking station, a tablet computer, a mobile computer, a digital media player, and/or any other such electronic device. It should be appreciated that the shape of either or both of the devices 101, 102 may vary. For example, the first device may not have a convex exterior surface and the second device may not have a mating concave surface. As yet another example, the convex exterior portion of the first device may be a part of a sphere or oblate spheroid and the concave exterior portion of the second device may have a corresponding, complementary shape. In other embodiments, the two devices and their mating or touching surfaces may be planar, angled, arcuate or any other suitable shape.

Figure 2A:
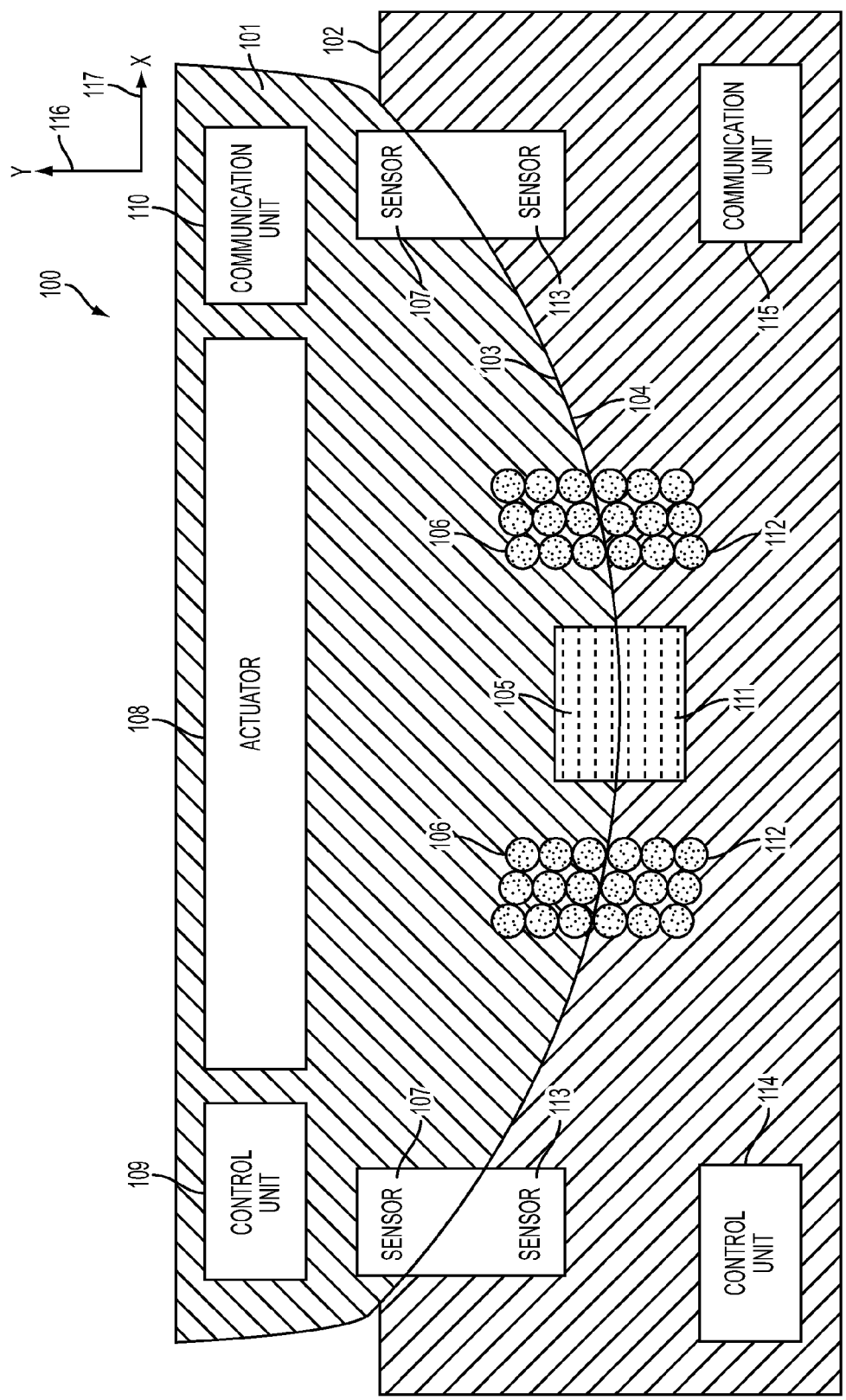
FIG. 2A is a cross-sectional view of the example system of FIG. 1 taken along the line 2A-2A of FIG. 1 illustrating first and second electronic devices in an aligned position.
Figure 2B:
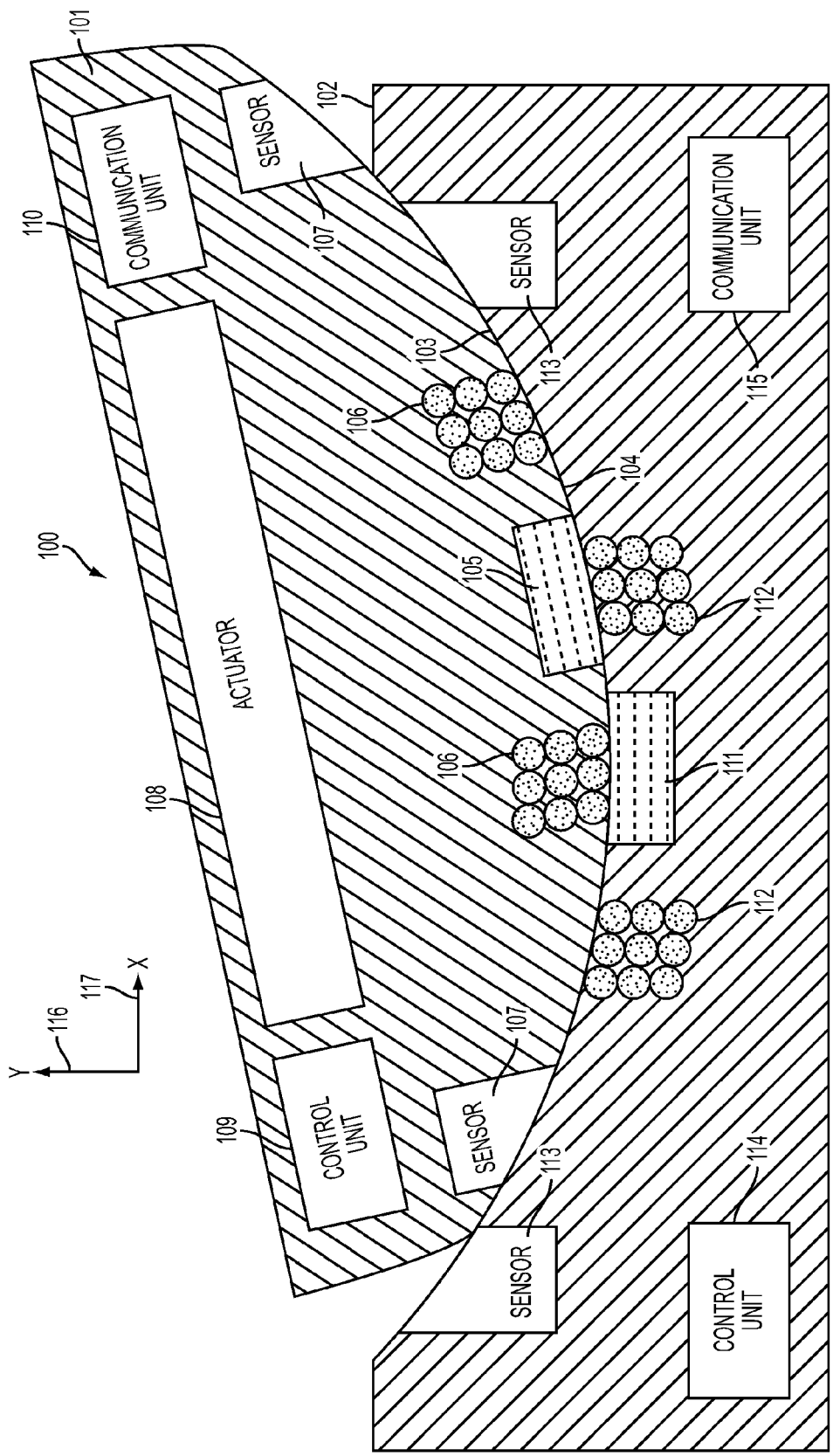
FIG. 2B illustrates the view of FIG. 2A when the first and second electronic devices are in one of a number of possible contact positions.

FIG. 2A is a cross-sectional view of the example system 100 of FIG. 1 taken along the line 2A-2A of FIG. 1 illustrating first and second electronic devices 101 and 102 in an aligned position. FIG. 2B illustrates the view of FIG. 2A when the first and second electronic devices are in one of a number of possible contact positions.

As illustrated in FIGS. 2A and 2B, the first and second electronic devices 101 and 102 may be connected by being brought into proximity in one or more contact positions where the first and second electronic devices are misaligned (see FIG. 2B) and one or more alignment mechanisms (such as gravity, geometry of the first and/or second electronic devices, alignment magnets, and/or other such mechanisms) may attempt to bring the first and second electronic devices into alignment, i.e. the aligned position (see FIG. 2A). In this example, the alignment mechanisms may include a combination of gravity, geometry of the interface surfaces 103 and 104 of the first and second electronic devices, and alignment magnets 105 and 111 (which may attract each other in both x and y directions 117 and 116, exerting both shear and normal forces to bring the first and second electronic devices from a contact position to the aligned position). However, it is understood that this is an example and that in other implementations other alignment mechanisms and/or combinations of alignment mechanisms are possible.

However, the first electronic device 101 may come to a rest between a contact position (see FIG. 2B) and the aligned position (see FIG. 2A) despite the alignment mechanisms. In such a case, the alignment mechanism may be insufficient to overcome the static friction between the first electronic device and the second electronic device 102, resulting in the first electronic device and the second electronic devices remaining misaligned.

To ameliorate this issue, one or more "sensors" of the first electronic device 101 may determine that the first electronic device is positioned in a contact position. In various implementations, such a sensor may be a control unit 109 (such as a processing unit), one or more sensors (such as a position sensor, a gyroscope, an accelerometer, a compass, a hall effect sensor, an optical sensor, an inductive coil, a capacitive sensor, an optical sensor, a force sensor, a magnetometer, a combination thereof, or other such sensor), component 106, or other such component. In various other implementations, the sensor may be a communication unit 110 (which may be any wired and/or wireless communication unit such as a Bluetooth antenna, and optical transmitter and/or receiver, and/or other such communication unit) that receives one or more signals from the second electronic device 102 (via a communication unit 115) indicating that the first electronic device is misaligned. In such case, the second electronic device may determine the misalignment utilizing a control unit 114, a component 112, sensor(s) 113, and/or other such components.

When misalignment (see FIG. 2B) is detected, one or more actuators 108 may be activated (such as via one or more signals from the control unit 109). Activation of the actuator may result in the first electronic device 101 moving to the aligned position (see FIG. 2A).

In some implementations, the actuator 108 may move the first electronic device 101 in one or more directions toward the aligned position when activated. In various cases, the actuator may be a linear actuator configured to contact or "tap" one or more internal portions of the first electronic device (such as an internal surface of an outer housing) to drive the first electronic device in a direction 117 towards the aligned position. For example, such a linear actuator may repeatedly tap an internal portion of a housing of the first electronic device in FIG. 2B until the first electronic device moves to the aligned position shown in FIG. 2A.

In other implementations, the actuator 108 may not directly move the first electronic device 101 toward the aligned position but may instead overcome static friction to put the first electronic device in motion, such as by vibrating the first electronic device. Once the first electronic device is in motion, the alignment mechanisms may only have to overcome kinetic friction between the first electronic device and the second electronic device 102 instead of the static friction. As kinetic friction between two objects may be less than static friction between the same two objects, the alignment mechanisms may be sufficient to overcome the kinetic friction between the first and second electronic devices to move the first electronic device to the aligned position even though those same mechanisms may not move the first device when it is static with respect to the second device.

Although FIGS. 2A and 2B illustrate that actuator 108 resulting in horizontal motion of the first electronic device 101, it is understood that this is an example. In various implementations, the actuator may result in the first and/or second electronic devices moving horizontally, vertically, and/or in any other direction without departing from the scope of the present disclosure. For example, in some cases the interfaces surfaces 103 and/or 104 may include one or more bumps and/or other discontinuities that push, and/or cause the first electronic device to "jump" if sufficient force is utilized, the first electronic device vertically as well as horizontally.

In still other implementations, the actuator may be an actuator other than the actuator 108 shown. In some cases, the actuator may be an electromagnet (which may be the alignment magnet 105, the component 106, and/or another component of the first electronic device 101) configured to repulse the first electronic device from the second electronic device 102. In some cases, the repulsion may be strong enough that the interfaces surfaces 103 and 104 no longer connect. In other cases, the repulsion may not be strong enough to fully separate the interface surfaces but may repel the first electronic device from the second electronic device such that the static friction between the two is reduced enabling the alignment mechanisms to bring the first electronic device into the aligned position and/or the first electronic device is put into motion (overcoming static friction) enabling the alignment mechanisms to overcome kinetic friction as opposed to static friction and bringing the first electronic device into the aligned position. In various cases, the actuator and the sensor 107 may be a single, unified component that performs both functions.

Though the first electronic device 101 is illustrated as having two sensors 107 configured in particular positions, it is understood that this is an example and that other configurations of various numbers of varying kinds of sensors are possible. As discussed above, various components of the first electronic device may function as the sensor(s) that determine that the first electronic device is misaligned.

By way of a first example, in some embodiments the sensors 107 and 113 may be optical transceivers that are operable to optically communicate with each other. In such a case, the optical transceivers 107 may determine that the first electronic device is in a contact position when they are unable to communicate with the optical transceivers 113. Upon such determination, the optical transceivers 107 may transmit one or more signals to the control unit 109 which may in turn transmit one or more signals to activate the actuator 108. In various cases, one or more of the sensors 107 and 113 may be optical transmitters and/or optical receivers instead of optical transceivers and may perform similar functions.

By way of a second example, in some embodiments the sensors 107 and 113 may be electrical contacts that complete a circuit when connected. In such a case, the control unit 109 may determine that the first electronic device is in a contact position when the circuit is not completed. Upon such determination, the control unit may transmit one or more signals to activate the actuator 108.

By way of a third example, in some embodiments the sensors 107 and 113 may be capacitive elements and a capacitance between the two elements may vary with the distance between the elements. In such a case, the control unit 109 may determine that the first electronic device is in a contact position based on a detected capacitance between the elements 107, 113. Upon such determination, the control unit may transmit one or more signals to activate the actuator 108. It should be noted that the capacitive elements may be sensors themselves, or one or both may be an electrode, reference plane or the like in order to facilitate measurement of capacitance between the elements.

By way of a fourth example, in some embodiments the sensors 107 may be Hall effect sensors (or magnetometers and/or other magnetic detection sensors) that detect a magnetic field of the alignment magnet 105 and/or the component 106. Such magnetic field may be different when the alignment magnet 105 is aligned with the alignment magnet 111 and/or the component 106 is aligned with the component 112. Based on such detected difference, the hall effect sensors may determine that the first electronic device 101 is misaligned. Upon such determination, the Hall effect sensors 107 may transmit one or more signals to the control unit 109 which may in turn transmit one or more signals to activate the actuator 108.

By way of a fifth example, in some embodiments the sensors 107 may be optical sensors (such as cameras, image sensors, and so on) that are operable to detect particular portions of the interface surface 104 (such as portions composed of differing materials than other portions, portions polished and/or otherwise finished differently than other portions, and so on) and/or markings (such as one or more dots, lines, rings, and/or other markings formed of various materials such as paint, infrared paint, and/or other materials) and/or other elements on the interface surface 104. In such a case, the optical sensors may determine that the first electronic device is in a contact position when the portion, mark, and/or other element is detected. Upon such determination, the optical sensors may transmit one or more signals to the control unit 109 which may in turn transmit one or more signals to activate the actuator 108.

By way of a sixth example, in various embodiments the communication unit 110 may function as the sensor. In such implementations, the communication unit 110 may determine that that the first electronic device 101 is in a contact position when a signal indicating such is received from the communication unit 115. In such a case, the communication unit 115 may transmit such a signal in response to one or more components of the second electronic device 102 (such as the sensors 113, the control unit 114, the component 112, and so on) determining that the first electronic device is in a contact position.

In various implementations, the first electronic device 101 may have different orientations and/or centers of gravity in a contact position than the aligned position. Examples of this can be seen in the aligned contact and contact positions shown in FIGS. 2A and 2B. As illustrated in this example, the first electronic device is positioned flat in the aligned position but skewed in a contact position. As also illustrated in this example, the first electronic device has different centers of gravity in the shown aligned and contact positions. It is understood that these particular orientation and center of gravity differences are examples and that various differences may be present in various implementations.

Regardless, in cases where the first electronic device has different orientations and/or centers of gravity that vary between a contact and aligned position, one or more position sensors (such as one or more gyroscopes, accelerometers, levels, and/or other position sensors) may detect misalignment.

By way of a first example, in some embodiments a sensor 107 may be position sensor that determines whether or not the first electronic device is level. In such a case, the position sensor may determine that the first electronic device is in a contact position when it is not level. Upon such determination, the sensor may transmit one or more signals to the control unit 109 which may in turn transmit one or more signals to activate the actuator 108.

By way of a second example, in some embodiments a sensor 107 may be a position sensor that determines the center of gravity for the first electronic device 101. In such a case, the position sensor may determine that the first electronic device is in a contact position when the center of gravity for the first electronic device is at a location other than one corresponding to the location of the alignment magnet 105. Upon such determination, the sensor may transmit one or more signals to the control unit 109 which may in turn transmit one or more signals to activate the actuator 108.

By way of a third example, in various embodiments the communication unit 110 may function as the sensor. The communication unit 110 may determine that that the first electronic device 101 is in a contact position when a signal indicating such is received from the communication unit 115. The sensors 113 may be force sensors and/or other sensors that detect the weight and/or pressure of the first electronic device on one or more portions of the interface surface 104 and the communication unit 115 may transmit the signal based on such detection. For example, force sensors may be positioned at either side of the interface surface 104 such that both are triggered only if the first electronic device is in the aligned position, or the force detected by both matches only if the first electronic device is in the aligned position. However, it is understood that this is an example and other configurations are possible.

In various implementations, the sensor may detect whether the first electronic device 101 is misaligned or not. However, in other implementations the sensor may be able to detect other information regarding the misalignment, such as the direction toward the aligned position, the distance toward the aligned position, and so on.

For example, the sensors 107 may be hall effect sensors that are operable to detect magnetic fields of the alignment magnets 111 and/or 105 and/or the components 112 and/or 106. Such magnetic fields may differ based on the positioning of the first electronic device 101 and the various magnetic fields detected by the hall effect sensors may be compared to determine the degree of misalignment between the first electronic device and the second electronic device 102 such as which possible contact position the first electronic device is in, the direction from that determined contact position to the aligned position, and/or the distance from the determined contact position to the aligned position. This information may be transmitted to the control unit 109 and the control unit may activate the actuator 108 utilizing such information to more specifically direct movement of the first electronic device toward the aligned position.

As illustrated in FIGS. 2A and 2B, the first and second electronic devices 101 and 102 may include one or more components 106 and 112 that are aligned in the aligned position (see FIG. 2A) and misaligned in a contact position (see FIG. 2B). Alignment of such components may enable connection and/or interaction between the first and second electronic devices whereas misalignment of such components may prevent connection and/or interaction between the first and second electronic devices and/or cause such connection and/or interaction to be less efficient.

For example, as illustrated the components 106 and 112 may be inductive power transmission coils with alignment magnets 105 and 111 positioned at their respective centers. The inductive power transmission coil 106 may be operable to inductively transmit power to and/or receive power from inductive power transmission coil 107 in the aligned position (see FIG. 2A). However, such power transmission may not be possible and/or may not be as efficient in a contact position (see FIG. 2B).

In various implementations, the sensor may be the inductive power transmission coil 106. For example, it may be determined that the first electronic device 101 is in a contact position as opposed to the aligned position if the inductive power transmission coil 106 either receives a different power level than what was expected to be transmitted or transmits a different power level than what is received by the inductive power transmission coil 112.

In various other implementations, the sensor may be the communication unit 110. The communication unit 110 may determine that that the first electronic device 101 is in a contact position when a signal indicating such is received from the communication unit 115. The communication unit 115 may transmit such a signal when the inductive power transmission coil 112 either receives a different power level than what was expected to be transmitted or transmits a different power level than what is received by the inductive power transmission coil 106.

Figure 3:
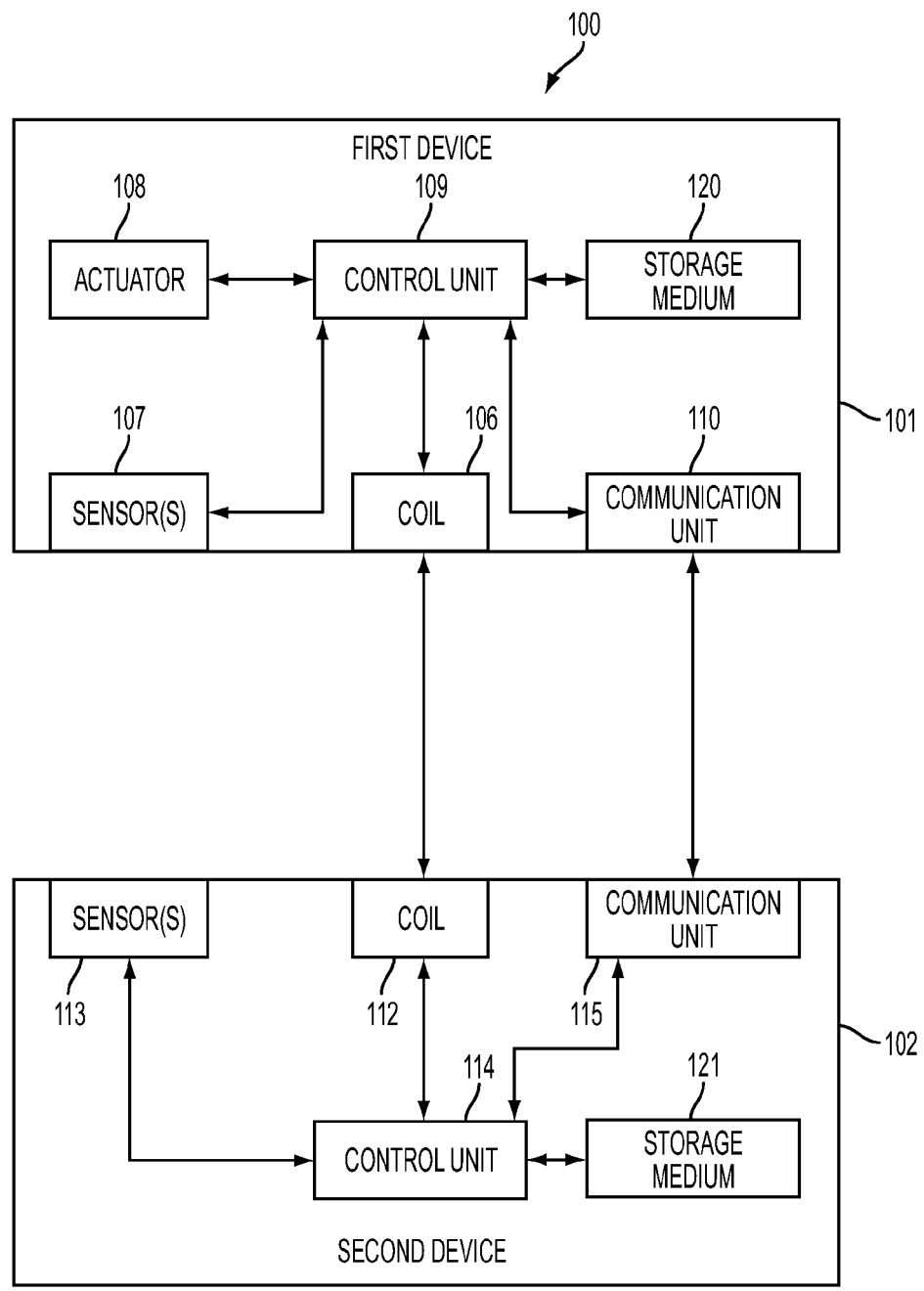
FIG. 3 is a block diagram illustrating possible functional relationships of components of the first and second electronic devices of the example system of FIG. 2A.

FIG. 3 is a block diagram illustrating possible functional relationships of components of the first and second electronic devices 101 and 102 of the example system of FIG. 2A. As illustrated, the first and/or second electronic devices may include one or more control units 109 and 114, one or more non-transitory storage media 120 and 121 (which may take the form of, but is not limited to, a magnetic storage medium; optical storage medium; magneto-optical storage medium; read only memory; random access memory; erasable programmable memory; flash memory; and so on), one or more actuators 108, one or more inductive transmission coils 106 and 107, one or more sensors 107 and 113, one or more communication units 110 and 115, and/or one or more other components.

Figure 4:
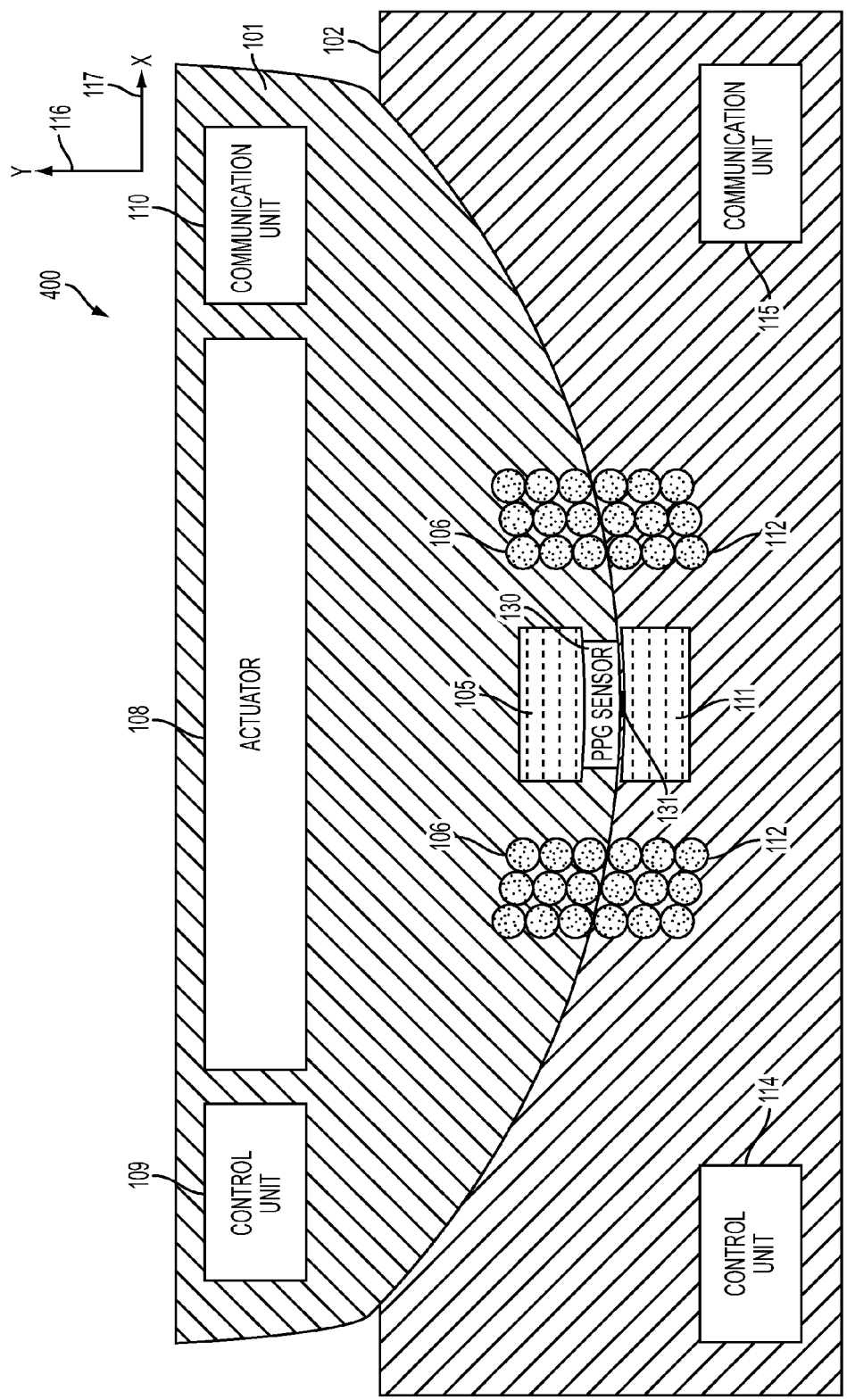
FIG. 4 is an example alternative implementation of the example system of FIG. 2A.

FIG. 4 is an example alternative implementation 400 of the example system 100 of FIG. 2A. To contrast with the example system of FIG. 2A, the first electronic device 101 may include an optical sensor 130 (whether a camera, PPG sensor, or the like) positioned between the alignment magnet 105 and the interface surface 103 and the second electronic device 102 may include a marked area 131 on the interface surface 104. The marked area may be one or more dots, lines, rings, and/or other markings forming a colored or other area composed of paint, infrared paint (such that it is not visible to the human eye), and/or other material. The optical sensor may determine that the first electronic device is misaligned when the optical sensor is unable to detect the marked area.

In some cases, the optical sensor 130 may have other functions than detecting misalignment when the first and second electronic devices 101 and 102 are not being connected. For example, the optical sensor may be a PPG sensor and utilized to detect various information about a user when the first electronic device is placed proximate to the user's skin.

Returning to FIG. 2A, although the present disclosure is illustrated and described as detecting when the first electronic device 101 is misaligned and moving the first electronic device, it is understood that this is an example. In various implementations, the positioning of the first electronic device and/or the second electronic device 102 may be different without departing from the scope of the present disclosure, such as implementations where the second electronic device is placed on top of the first electronic device during connection, and misalignment of the second electronic device may be detected and/or the second electronic device may be performed based on various detected misalignments.

Further, although the present disclosure is illustrated and described as bringing the first electronic device 101 into an aligned position from a contact position when brought into proximity with the second electronic device 102, it is understood that this is an example. In various cases, the first and second electronic devices may be in an aligned position and then move to a contact position as a result of jarring and/or other circumstances. In such cases, the change to misalignment may be detected and one or more actuators may be activated to return the first and second electronic devices to the aligned position without departing from the scope of the present disclosure.

Figure 5:
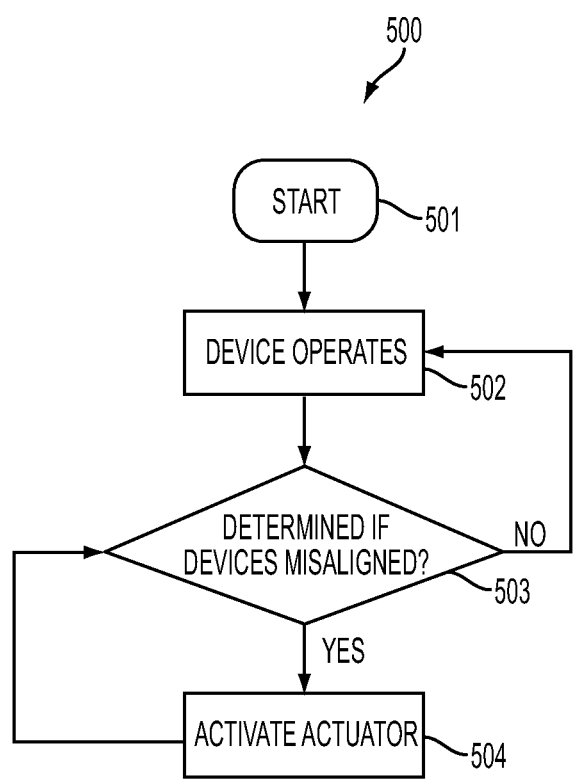
FIG. 5 is a flow chart illustrating a method for actuator assisted alignment of connectible devices. This method may be performed by the example systems of FIGS. 1-4.

FIG. 5 is a flow chart illustrating a method 500 for actuator assisted alignment of connectible devices. This method may be performed by the example systems of FIGS. 1-4.

The flow begins at block 501 and proceeds to block 502 where a device that is connectible to another electronic device operates. The flow then proceeds to block 503 where the electronic device determines whether or not the electronic device is misaligned with the other electronic device. If so, the flow proceeds to block 504. Otherwise, the flow returns to block 502 where the electronic device continues to operate.

At block 504, after the electronic device determines the electronic device is misaligned with the other electronic device, the electronic device activates one or more actuators that result in the electronic device moving to the aligned position.

The flow then returns to block 503 where the electronic device determines whether or not the electronic device is misaligned with the other electronic device.

Although the method 500 is illustrated and described as including particular operations performed in a particular order, it is understood that this is an example. In various implementations, various orders of the same, similar, and/or different operations may be performed without departing from the scope of the present disclosure.

For example, the method 500 is illustrated and described as returning to the block where the electronic device checks for misalignment after activating the actuator. However, in various implementations the electronic device may return to the block where the electronic device continues to operate after activating the actuator without departing from the scope of the present disclosure.

By way of another example, the method 500 is illustrated and described as checking for misalignment during operation of the electronic device. However, in various implementations the electronic device may first check for proximity of the other electronic device before checking for misalignment without departing from the scope of the present disclosure.

As described above and illustrated in the accompanying figures, the present disclosure discloses systems, apparatuses, and methods for actuator assisted alignment of connectible devices. A first electronic device may be positionable between one or more contact positions and an aligned position with respect to a second electronic device. One or more actuators of the first electronic device may be activated in response to one or more sensors of the first electronic device determining that the first electronic device and second electronic device are misaligned, i.e. the first electronic device is in a contact position instead of the aligned position. Activation of the actuator may result in the first electronic device moving from the contact position to the aligned position.

In the present disclosure, the methods disclosed may be implemented as sets of instructions or software readable by a device. Further, it is understood that the specific order or hierarchy of steps in the methods disclosed are examples of sample approaches. In other embodiments, the specific order or hierarchy of steps in the method can be rearranged while remaining within the disclosed subject matter. The accompanying method claims present elements of the various steps in a sample order, and are not necessarily meant to be limited to the specific order or hierarchy presented.

Techniques based on the described disclosure may performed utilizing a computer program product, or software, that may include a non-transitory machine-readable medium having stored thereon instructions, which may be used to program a computer system (or other electronic devices) to perform a process according to the present disclosure. A non-transitory machine-readable medium includes any mechanism for storing information in a form (e.g., software, processing application) readable by a machine (e.g., a computer). The non-transitory machine-readable medium may take the form of, but is not limited to, a magnetic storage medium (e.g., floppy diskette, video cassette, and so on); optical storage medium (e.g., CD-ROM); magneto-optical storage medium; read only memory (ROM); random access memory (RAM); erasable programmable memory (e.g., EPROM and EEPROM); flash memory; and so on.

It is believed that the present disclosure and many of its attendant advantages will be understood by the foregoing description, and it will be apparent that various changes may be made in the form, construction and arrangement of the components without departing from the disclosed subject matter or without sacrificing all of its material advantages. The form described is merely explanatory, and it is the intention of the following claims to encompass and include such changes.

While the present disclosure has been described with reference to various embodiments, it will be understood that these embodiments are illustrative and that the scope of the disclosure is not limited to them. Many variations, modifications, additions, and improvements are possible. More generally, embodiments in accordance with the present disclosure have been described in the context or particular embodiments. Functionality may be separated or combined in blocks differently in various embodiments of the disclosure or described with different terminology. These and other variations, modifications, additions, and improvements may fall within the scope of the disclosure as defined in the claims that follow.

We claim:

1. A wireless power transfer electronic device comprising:
a first coil positioned adjacent to a charging surface;
a sensor configured to detect misalignment between the wireless power transfer electronic device and a second wireless power transfer electronic device positioned against the charging surface in at least one contact position, the second wireless power transfer electronic device comprising a second coil, the wireless power transfer electronic device configured to perform wireless power transfer with the second wireless power transfer electronic device, wherein the wireless power transfer operation is enabled when the wireless power transfer electronic device and the second wireless power transfer electronic device are aligned;
at least one actuator configured to generate a vibrating force that decreases the static friction between the wireless power transfer electronic device and the second wireless power transfer electronic device in response to the sensor detecting misalignment while the wireless power transfer electronic device and the second wireless power transfer electronic device are in contact with each other so that the first coil is aligned with the second coil; and
a magnet positioned adjacent to the charging surface and configured to work in conjunction with the vibrating force generated by the at least one actuator to generate a magnetic force that overcomes kinetic friction between the wireless power transfer electronic device and the second wireless power transfer electronic device once the at least one actuator has generated the vibrating force to overcome the static friction, and that is sufficient to move the wireless power transfer electronic device toward the aligned position.

2. The wireless power transfer electronic device of claim 1, wherein the at least one actuator overcomes static friction to put the wireless power transfer electronic device in motion.

3. The wireless power transfer electronic device of claim 2, further comprising at least one alignment mechanism comprising at least one of gravity, or geometry of interface surfaces of the wireless power transfer electronic device and the second wireless power transfer electronic device.

4. The wireless power transfer electronic device of claim 1, wherein the sensor comprises a position sensor, a gyroscope, an accelerometer, a compass, a hall effect sensor, a photoplethysmograph sensor, an inductive coil, a capacitive sensor, an optical sensor, a force sensor, a magnetometer, or a combination thereof.

5. The wireless power transfer electronic device of claim 1, wherein the sensor comprises at least one communication component that receives at least one signal from the second wireless power transfer electronic device indicating at least one of that the wireless power transfer electronic device is positioned in the at least one contact position, a direction from the at least one contact position to the aligned position, or a distance between the at least one contact position and the aligned position.

6. The wireless power transfer electronic device of claim 1, wherein the at least one actuator comprises a linear actuator.

7. The wireless power transfer electronic device of claim 1, further comprising a second magnet, wherein the magnet and the second magnet are respectively positioned at a center of the first and second coils.

8. The wireless power transfer electronic device of claim 1, wherein the at least one actuator comprises at least one electromagnet that repulses the wireless power transfer electronic device from the second wireless power transfer electronic device.

9. The wireless power transfer electronic device of claim 1, wherein the sensor comprises at least one optical sensor that detects a marked area of an interface surface of the second wireless power transfer electronic device.

10. The wireless power transfer electronic device of claim 9, wherein the marked area comprises a colored area.

11. The wireless power transfer electronic device of claim 10, wherein the colored area comprises infrared paint.

12. The wireless power transfer electronic device of claim 1, wherein the sensor comprises at least one position sensor that determines that the wireless power transfer electronic device is positioned in the at least one contact position by detecting at least one of an orientation of the wireless power transfer electronic device or a center of gravity of the wireless power transfer electronic device.

13. The wireless power transfer electronic device of claim 1, wherein the at least one sensor comprises at least one inductive power transmission coil that determines that the wireless power transfer electronic device is positioned in the at least one contact position by detecting that a received power differs from a transmitted power.

14. The wireless power transfer electronic device of claim 1, wherein the sensor comprises a photoplethysmograph sensor positioned between at least one alignment magnet of the wireless power transfer electronic device and an interface surface of the wireless power transfer electronic device.

15. The wireless power transfer electronic device of claim 1, wherein the sensor further detects at least one of a direction from the at least one contact position to the aligned position or a distance between the at least one contact position and the aligned position.

16. The electronic device of claim 1, wherein the first coil is a receiver coil configured to receive power transmitted wirelessly from the second coil in the second wireless power transfer electronic device.

17. The electronic device of claim 1, wherein the second coil is a transmission coil configured to transmit power transmitted wirelessly to the first coil in the wireless power transfer electronic device.

18. The wireless power transfer electronic device of claim 1, wherein the wireless power transfer electronic device is a wearable device, and the at least one actuator, sensor, and first coil are disposed in the wearable device.

19. The wireless power transfer electronic device of claim 18, further comprising a control unit coupled to the actuator and configured to activate the actuator in response to detecting misalignment between the wireless power transfer electronic device and a second wireless power transfer electronic device.

20. The wireless power transfer electronic device of claim 1, wherein the actuator is configured to generate a vibration to overcome static friction between the wireless power transfer electronic device and a second wireless power transfer electronic device during misalignment.

21. A system for aligning and wirelessly charging an electronic device, the system comprising:
a first electronic device having a receiver coil positioned adjacent to a first device charging surface;
a second electronic device having a transmitter coil positioned adjacent to a second device charging surface, the transmitter coil configured to wirelessly transmit power to the receiver coil during a wireless charging operation, wherein the wireless charging operation is enabled when the first device charging surface is in an aligned position with the second device charging surface;
a sensor in at least one of the first or second electronic devices that detects if the first and second electronic devices are misaligned;
at least one actuator configured to generate a vibrating force that decreases the static friction between the first electronic device and the second electronic device in response to the sensor detecting that the first and second electronic devices are misaligned while the first and second device charging surfaces are contacting each other; and
a first magnet positioned adjacent to the first device charging surface and configured to work in conjunction with the vibrating force generated by the at least one actuator to generate a magnetic force that overcomes kinetic friction between the wireless power transfer electronic device and second wireless power transfer electronic device once the at least one actuator has generated the vibrating force to overcome the static friction, and that is sufficient to move the wireless power transfer electronic device toward the aligned position.

22. The system of claim 21, wherein the second electronic device includes a second magnet, the sensor comprises first and second hall effect sensors positioned at sides of the first alignment magnet, and the detection is based at least on a comparison of magnetic fields respectively detected by the first and second hall effect sensors.

23. The system of claim 21, wherein the at least one actuator is positioned in the first electronic device.

24. The system of claim 21, wherein the at least one actuator is positioned in the second electronic device.

25. A method for aligning wireless power transfer devices, the method comprising:
determining that a first electronic device is in a misaligned contact position with respect to a second electronic device utilizing at least one sensor, the misaligned contact position is a position where the first electronic device makes contact with the second electronic device and a first coil in the first electronic device is misaligned with a second coil in the second electronic device;
activating at least one actuator in response to the determination wherein activation of the at least one actuator results in generation of a vibrating force that decreases the static friction between the wireless power transfer electronic device and the second wireless power transfer electronic device; and
using a magnet positioned adjacent to the charging surface to work in conjunction with the vibrating force generated by the at least one actuator to generate a magnetic force that overcomes kinetic friction between the wireless power transfer electronic device and the second wireless power transfer electronic device once the at least one actuator has generated the vibrating force to overcome the static friction, and that is sufficient to move the wireless power transfer electronic device toward the aligned position.

* * * * *